US010110986B1

(12) United States Patent
Min

(10) Patent No.: US 10,110,986 B1
(45) Date of Patent: Oct. 23, 2018

(54) HAPTIC FEEDBACK FOR HEAD-WEARABLE SPEAKER MOUNT SUCH AS HEADPHONES OR EARBUDS TO INDICATE AMBIENT SOUND

(71) Applicant: Motorola Mobility LLC, Chicago, IL (US)

(72) Inventor: Jun-Ki Min, Chicago, IL (US)

(73) Assignee: MOTOROLA MOBILITY LLC, Chicago, IL (US)

( * ) Notice: Subject to any disclaimer, the term of this patent is extended or adjusted under 35 U.S.C. 154(b) by 0 days.

(21) Appl. No.: 15/471,977

(22) Filed: Mar. 28, 2017

(51) Int. Cl.
*H03G 3/32* (2006.01)
*H04R 1/10* (2006.01)
*H04R 3/12* (2006.01)

(52) U.S. Cl.
CPC ......... *H04R 1/1075* (2013.01); *H04R 1/1083* (2013.01); *H04R 3/12* (2013.01); *H04R 2420/07* (2013.01); *H04R 2460/13* (2013.01)

(58) Field of Classification Search
CPC ...... H04R 1/1075; H04R 1/1083; H04R 3/12; H04R 2420/07; H04R 2460/13
USPC ................................ 381/26, 55, 58, 74, 94.5
See application file for complete search history.

(56) References Cited

U.S. PATENT DOCUMENTS

| | | | | |
|---|---|---|---|---|
| 9,398,367 | B1 * | 7/2016 | Scott | H04R 1/1083 |
| 2013/0293723 | A1 * | 11/2013 | Benson | G02B 27/017 348/164 |
| 2015/0003651 | A1 * | 1/2015 | Han | H04R 1/1041 381/312 |
| 2015/0005039 | A1 * | 1/2015 | Liu | H04M 1/72569 455/567 |
| 2016/0192073 | A1 * | 6/2016 | Poornachandran | G10L 25/51 381/26 |
| 2017/0213568 | A1 * | 7/2017 | Foshee | G10L 21/16 |

* cited by examiner

*Primary Examiner* — Norman Yu
(74) *Attorney, Agent, or Firm* — John L. Rogitz

(57) ABSTRACT

Haptic feedback is generated on a headphone to indicate contexts of ambient sound. In this way, noise-canceling headphones can alert the wearer to audible cues of potentially dangerous situations that otherwise would be suppressed by the noise cancellation feature of the headphones.

20 Claims, 5 Drawing Sheets

| | | |
|---|---|---|
| 1. | Loud vehicle approaching | Actuate some but not all haptic at high level closest to vehicle direction |
| 2. | Loud honk from vehicle | Actuate all haptic at max |
| 3. | Spoken name of user | Actuate haptic in speaker mount closest to direction of speaker |

HAPTIC FEEDBACK FOR HEAD-WEARABLE SPEAKER MOUNT SUCH AS HEADPHONES OR EARBUDS TO INDICATE AMBIENT SOUND

FIELD

The present application relates to technically inventive, non-routine solutions that are necessarily rooted in computer technology and that produce concrete technical improvements.

BACKGROUND

The use of headphones for listening to music, hands-free phone calls, interacting with virtual assistants, etc. is widespread. Comfortable wireless headphones and smart-wearable technology accelerate the use of hearable devices for a wide variety of purposes.

As recognized herein, to improve listening fidelity, headphones may employ noise canceling/isolating features which cancel/block ambient sound. As also recognized herein, such noise reduction carries with it the risk of accident as people use the headphones in a variety of situations, such as close to traffic, in which traffic sound is reduced by the headphones. Moreover, people using noise-canceling headphones are more likely to miss other audible cues such as someone calling their name. The same concern applies when a user is using headphones with volume so loud that the user cannot hear ambient sound.

SUMMARY

With the above problems in mind, present principles detect ambient contexts that require user attention, and notify the user of such using haptic feedback without disrupting use of the headphones.

Accordingly, in one aspect a storage that is not a transitory signal includes instructions executable by a processor to sense ambient sound using at least one microphone on a head-wearable speaker assembly. The instructions are executable to determine at least one parameter of the ambient sound, and based at least in part on the parameter, activate at least one haptic generator on the head-wearable speaker assembly.

The parameter may include a type of sound and/or a direction of sound and/or a location of sound origination and/or an amplitude of sound and/or speech in the ambient sound.

In example embodiments, the instructions may be executable to, based at least in part on the parameter, establish a location of haptic feedback on the head-wearable speaker assembly. In some examples, the instructions are executable to, based at least in part on the parameter, establish an intensity of haptic feedback on the head-wearable speaker assembly. In non-limiting example implementations, the instructions can be executable to, based at least in part on a speaker volume of the head-wearable speaker assembly, establish an intensity of haptic feedback on the head-wearable speaker assembly. Different haptic intensity may help users notify ambient situations (the higher volume the headphones are in, the stronger vibration feedback to get user attention).

In another aspect, a method includes determining a context of ambient sound impinging on a wearable listening device, and based at least in part on the context, activating at least one haptic generator to provide feedback of the ambient sound.

In another aspect, an apparatus includes at least one head-wearable mount, at least one speaker on the head-wearable mount, and at least one microphone on the head-wearable mount. At least one haptic generator is on the head-wearable mount. The apparatus is adapted to activate the haptic generator responsive to ambient sound sensed by the microphone.

The details of present principles, both as to their structure and operation, can best be understood in reference to the accompanying drawings, in which like reference numerals refer to like parts, and in which:

DETAILED DESCRIPTION

Figure 1:
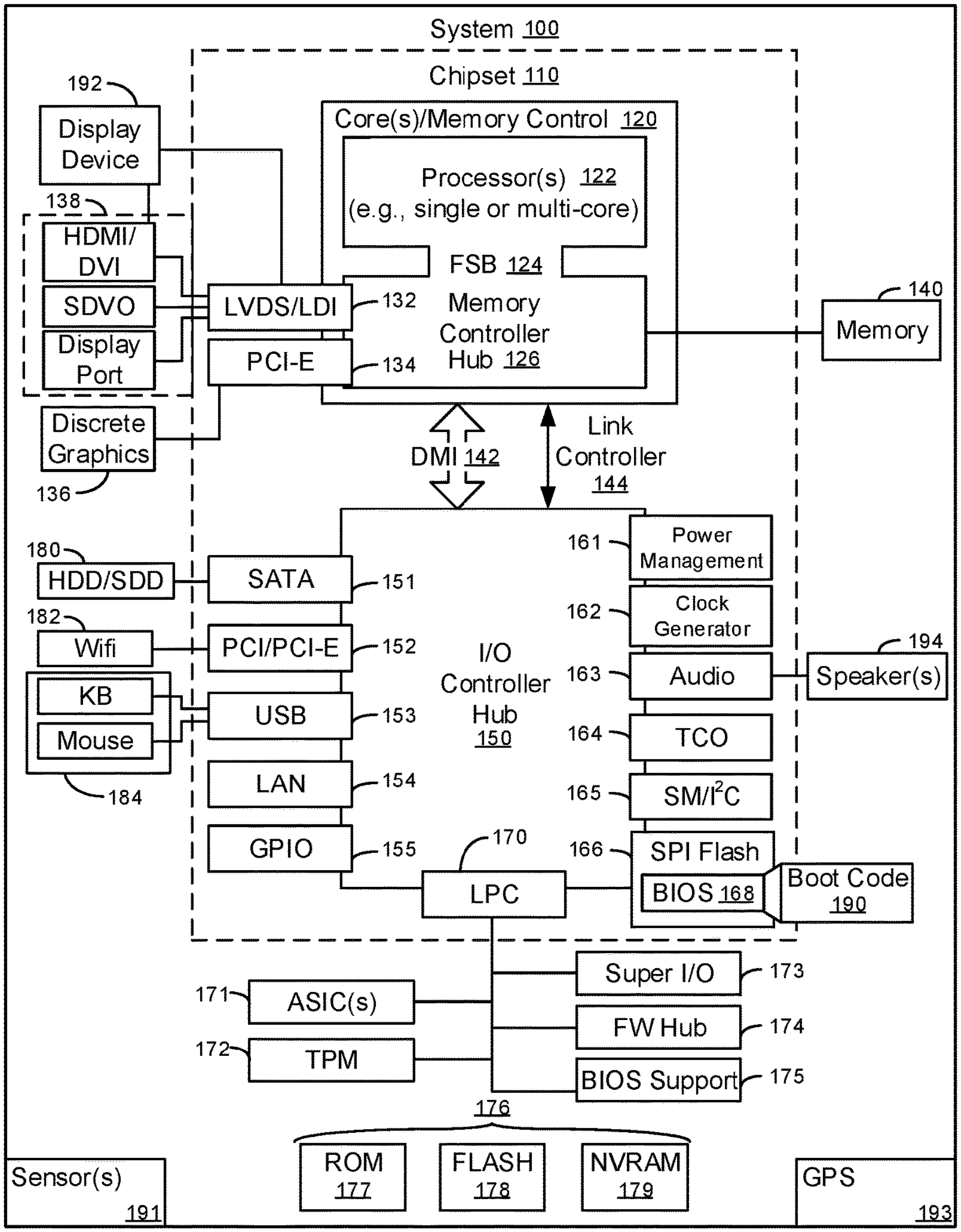
FIG. 1 is a block diagram of an example system in accordance with present principles.

With respect to any computer systems discussed herein, a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple Inc. of Cupertino Calif., Google Inc. of Mountain View, Calif., or Microsoft Corp. of Redmond, Wash. A Unix® or similar such as Linux® operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware, or combinations thereof and include any type of programmed step undertaken by components of the system; hence, illustrative components, blocks, modules, circuits, and steps are sometimes set forth in terms of their functionality.

A processor may be any conventional general purpose single- or multi-chip processor that can execute logic by means of various lines such as address lines, data lines, and control lines and registers and shift registers. Moreover, any logical blocks, modules, and circuits described herein can be implemented or performed with a general purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

Software modules and/or applications described by way of flow charts and/or user interfaces herein can include various sub-routines, procedures, etc. Without limiting the disclosure, logic stated to be executed by a particular module can be redistributed to other software modules and/or combined together in a single module and/or made available in a shareable library.

Logic when implemented in software, can be written in an appropriate language such as but not limited to C# or C++, and can be stored on or transmitted through a computer-readable storage medium (e.g., that is not a transitory signal) such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Now specifically in reference to FIG. 1, an example block diagram of an information handling system and/or computer system 100 is shown that is understood to have a housing for the components described below. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a mobile communication device such as a mobile telephone, notebook computer, and/or other portable computerized device.

As shown in FIG. 1, the system 100 may include a so-called chipset 110. A chipset refers to a group of integrated circuits, or chips, that are designed to work together. Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the conventional "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (×16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case the drives 180 are understood to be, e.g., tangible computer readable storage mediums that are not transitory signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB), mice and various other devices (e.g., cameras, phones, storage, media players, etc.).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAM) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

The system 100 may also include one or more sensors 191 from which input may be received for the system 100. For example, the sensor 191 may be an audio receiver/microphone that provides input from the microphone to the processor 122 based on audio that is detected, such as via a user providing audible input to the microphone, so that the user may be identified based on voice identification. As another example, the sensor 191 may be a camera that gathers one or more images and provides input related thereto to the processor 122 so that the user may be identified based on facial recognition or other biometric recognition. The camera may be a thermal imaging camera, a digital camera such as a webcam, a three-dimensional (3D) camera, and/or a camera otherwise integrated into the system 100 and controllable by the processor 122 to gather pictures/images and/or video. The sensor 191 may also be, for instance, another kind of biometric sensor for use for such purposes, such as a fingerprint reader, a pulse monitor, a heat sensor, etc.

The sensor 191 may even be a motion sensor such as a gyroscope that senses and/or measures the orientation of the system 100 and provides input related thereto to the processor 122, and/or an accelerometer that senses acceleration and/or movement of the system 100 and provides input related thereto to the processor 122. Thus, unique and/or particular motion or motion patterns may be identified to identify a user as being associated with the motions/patterns in accordance with present principles.

Additionally, the system 100 may include a location sensor such as but not limited to a global positioning satellite (GPS) transceiver 193 that is configured to receive geographic position information from at least one satellite and provide the information to the processor 122. However, it is to be understood that another suitable position receiver other than a GPS receiver may be used in accordance with present principles to determine the location of the system 100. In some embodiments, the GPS transceiver 193 may even establish a sensor for use in accordance with present principles to identify a particular user based on the user being associated with a particular location (e.g., a particular building, a particular location within a room of a personal residence, etc.)

It is to be understood that an example client device or other machine/computer may include fewer or more features than shown on the system 100 of FIG. 1. In any case, it is to be understood at least based on the foregoing that the system 100 is configured to undertake present principles.

Figure 2:
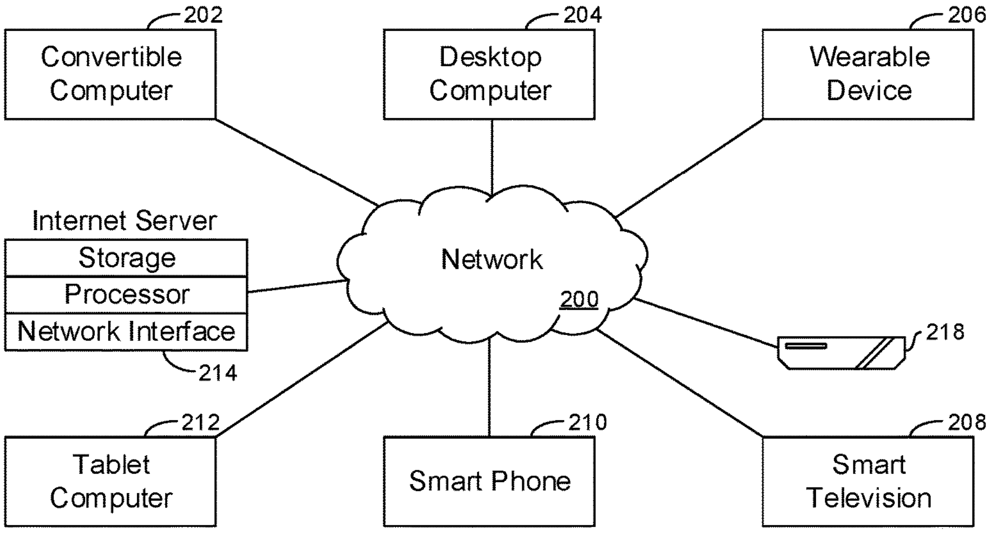
FIG. 2 is a block diagram of an example network of devices in accordance with present principles.

Turning now to FIG. 2, example devices are shown communicating over a network 200 such as the Internet in accordance with present principles. It is to be understood that each of the devices described in reference to FIG. 2 may include at least some of the features, components, and/or elements of the system 100 described above.

FIG. 2 shows a notebook computer and/or convertible computer 202, a desktop computer 204, a wearable device 206 such as an earbud-type or other headphone, a smart television (TV) 208, a smart phone 210, a tablet computer 212, a server 214 such as an Internet server that may provide cloud storage accessible to the devices shown in FIG. 2, and a game console 218. It is to be understood that the devices shown in FIG. 2 are configured to communicate with each other over the network 200 to undertake present principles.

Figure 3:
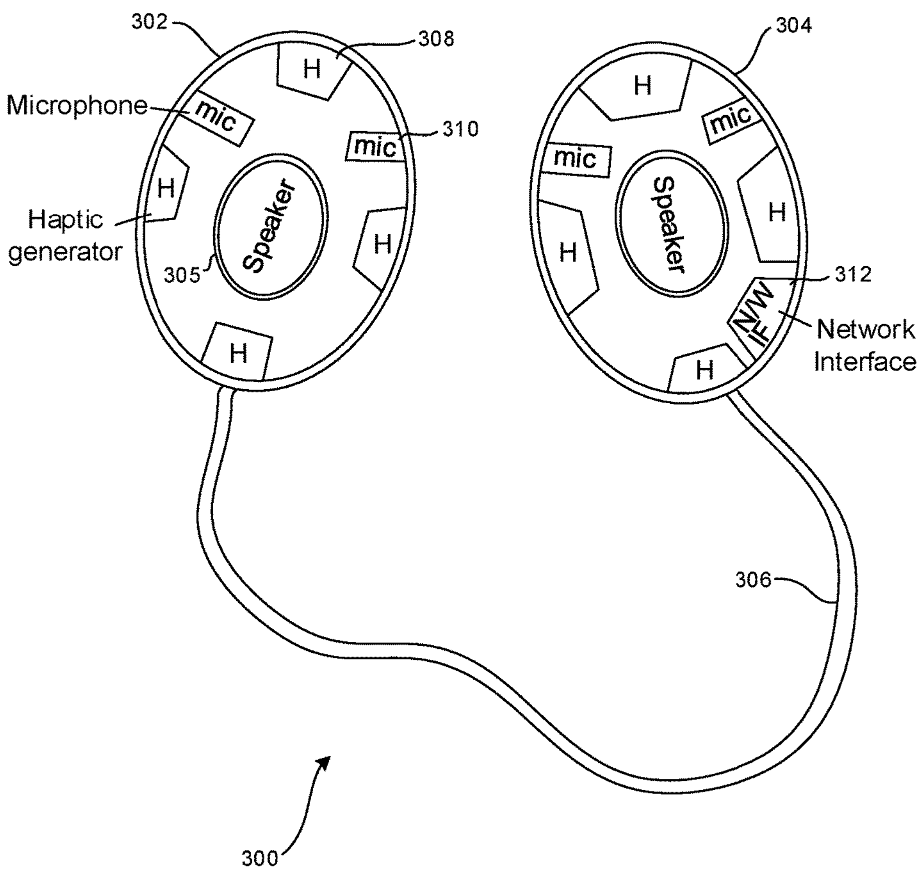
FIG. 3 is a schematic diagram illustrating an example earbud-type headphone with ambient sound detecting microphones and haptic feedback generators.

FIG. 3 shows a head-wearable speaker assembly 300 embodied by earbuds having left and right head-wearable mounts 302, 304 each holding one or more speakers 305. Typically, the electronics in the mounts 302, 304 are connected via a flaccid cord 306. It is to be understood that other types of head-wearable speaker assemblies are contemplated, such as headphones connected by a non-flaccid head band in which the left and right speaker mounts include cushions that surround the entire ear.

At least one and if desired both mounts 302, 304 include one more haptic generators 308. In the example shown, each speaker mount includes four haptic generators, one near the top of the mount (relative to when the mount is worn), one near the bottom, and two near each side intermediate the top and bottom of the mount.

Furthermore, at least and if desired both mounts may support one or more microphones 310, which can include ultrasonic microphones. In the example shown, both mounts include two microphones that are laterally spaced from each other as shown. It is to be understood that in some embodiments one mount may have two microphones laterally spaced from each and the other mount may have two microphones vertically spaced from each other for purposes of three dimensional triangulation. Also, one or both mounts may support one or more network interfaces 312 such as but not limited to Bluetooth transceivers, Wi-Fi transceivers, and wireless telephony transceivers. A processor and a storage medium with instructions executable by the processor may be incorporated into the head-wearable speaker assembly 300. In addition or alternatively, signals from the microphone and activation signals to the haptic generators may be exchanged through the interface 312 with a nearby mobile device processor or even a cloud processor to execute logic herein.

Figures 4, 5:
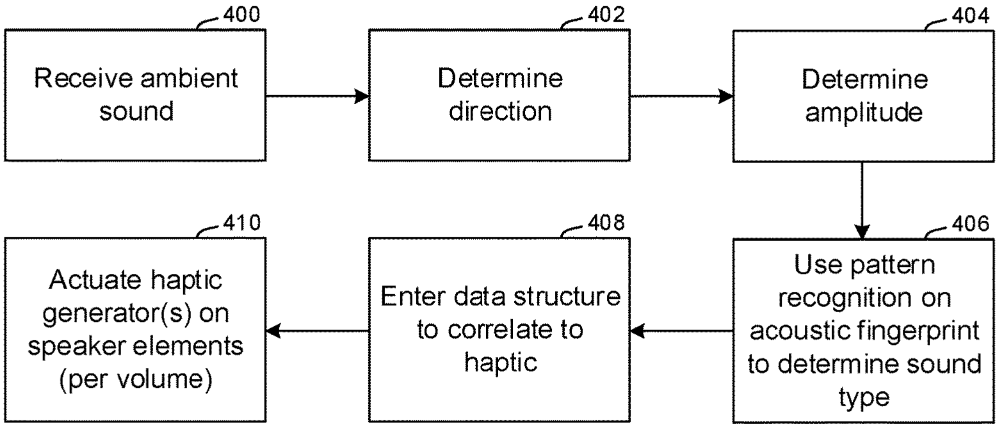
FIG. 4 is a flow chart of example logic consistent with present principles.
FIG. 5 is an example data structure correlating ambient sounds to haptic feedback.

FIG. 4 illustrates example logic that may be executed by a processor in the assembly 300 or other processor in wired or wireless communication therewith. As described more fully below, to detect alert type sound and/or machine noises, specific sound frequencies that represent the sound can be used as features. To implement the detection and recognition in a low-power, a specialized/dedicated chip can be used, such as a NPU (neural processing unit) or GPU unit.

Commencing at block 400, ambient sound is sensed by the microphones 310. By "ambient" sound or noise is meant sound or noise outside the assembly 300 that is not generated by the speakers 305.

Moving to block 402, the context of the ambient sound is identified. The context may include the direction of the ambient sound relative to the assembly 300. In one example embodiment, the direction is determined by triangulation using differences in times of arrival of the same sound at the different microphones 310, with the differences being converted to distances and the distances used to triangulate the direction of sound. The triangulation can also indicate the location of the source of the ambient sound as being the convergence of the triangulated lines of bearing derived from the different times of arrival of the sound at the various microphones 310.

For sound localization, the logic may employ several cues, including time differences between sound arrivals at microphones and ambient level differences (or intensity differences) between multiple microphones, which may be implemented as arrays. Other cues may include spectral information, timing analysis, correlation analysis, and pattern matching. Localization can be described in terms of three-dimensional position: the azimuth or horizontal angle, the elevation or vertical angle, and the distance (for static sounds) or velocity (for moving sounds). The localization can be implemented in various ways by using different techniques.

Thus if desired, the context of the sound can also include amplitude, which may be determined at block 404. The amplitude may be used to infer distance of the source of the sound using, e.g., a lookup table correlating amplitudes with distance, with distance having a squared relationship with amplitude, in non-limiting examples.

The context of the ambient sound can also include a type of sound, which may be determined at block 406. In one example, the type of sound may be determined using pattern recognition. It may first be determined using voice recognition whether the sound is a spoken word or phrase and if so, the spoken word or phrase is identified. For example, to detect human voice and speech, noise reduction may first be applied to sound detected by one or more microphones 310. This may include spectral subtraction. Then, one or more features or quantities of the detected sound may be calculated from a section of the input signal and a classification rule is applied to classify the section as speech or non-speech.

For non-spoken sound, a digital fingerprint of the sound may be used as entering argument to a library of fingerprints and a match returned, with the library correlating the matching fingerprint with a sound type, e.g., horn honking, tires screeching, engine running, etc. Note that the sound may include a Doppler shift, with an up-shift indicating that the source of sound is approaching and a down-shift indicating that the source of sound is receding.

Additional details regarding determining a type of sound can include determining different importances for types of ambient sound depend on context. For example, ambient sound classified as noise from an approaching vehicle approaching can be accorded a high importance (and thus a first type haptic feedback as described below) responsive to identifying, using, for example, location information from a GPS sensor such as that shown in FIG. 1 and embedded in the headphones, when the user is walking across the street. The same type of sound may be accorded a lower importance (and hence a second haptic feedback) when, for example, GPS location information indicates the user is walking on a sidewalk.

Types of sound of interest include a human voice (audible cues such as someone calling), alert-type noises (such as sirens, honks, etc.), machine noises (such as vehicle engine sounds, braking noises, etc.)

Once the context of the ambient sound has been identified, the logic may proceed to block 408 to correlate the sound to haptic feedback. In a simple implementation, once any ambient sound is sensed with an amplitude above a threshold, a haptic generator may be activated. More complex implementations are envisioned. For example, a data structure correlating different ambient sound contexts to different haptic feedback types may be accessed. FIG. 5 illustrates an example structure in which ambient sounds in a left column are correlated with haptic feedback types in a right column.

In the non-limiting example shown, when the logic of blocks 402-406 identifies a loud (from amplitude) vehicle (from digital fingerprint) is approaching (from Doppler shift or triangulation), some but not all of the haptic generators 308 are activated, at, for instance, a relatively high amplitude of haptic generation in a pulsed fashion for short period. The haptic generators 308 closest to the direction of the approaching vehicle as identified from triangulation described above may be activated to give an indication of the direction of the vehicle, and other haptic generators can remain inactive.

Other non-limiting examples of ambient context-haptic feedback shown in FIG. 5 include a loud vehicle honk causing all haptic generators to be activated at maximum energy level (maximum haptic generation), continuously. Or, when a spoken name is identified to be that of the user of the assembly 300, a haptic generator in the speaker mount 302, 304 that is closest to the source of the spoken name may be activated to generate, e.g., a soft, short buzz. Thus, haptic activation type may include one or more of amplitude of haptic signal, type of haptic signal, number of haptic generators activated, and location on the assembly 300 of the haptic generators that are activated.

Still in reference to haptic feedback, directional information of the ambient sound can be presented by operating different motors embedded in different position on the earphone units. Distance and importance of the sound can be represented by using different intensity of the vibration along with the different number of motors to operate. As an example, the closer and the more important the sound is, the stronger haptic vibration is generated. Different types of haptic feedbacks can be generated using one or combinations of variations of 1) different frequency of vibration, 2) different intensity of the vibration (generated by different torque), 3) different number of motors that are generating the haptic feedback.

In an illustrated example, let different types of haptic feedback be denoted as follows:

'_' be a weak & long vibration

'=' be a strong & long vibration

'.' be a weak & short vibration

'*' be a strong & short vibration, and

' ' is a pause

Then, different types of sound can be represented with the combinations of the haptic patterns. For example, responsive to identifying that someone is calling a user: '.' (weak & short vibration) may be generated. Responsive to identifying that someone is calling a user urgently: '*' (a strong & short vibration) can be generated. On the other hand, responsive to identifying that a car is approaching, multiple weak and short vibrations separated by short rest periods may be used ('. . . ')

Continuing this illustration responsive to identifying that a car is approaching very closely, multiple strong and short vibrations separated by short rest periods may be used ('* * *'). Responsive to identifying that there is an alarm sound that requires user attention, multiple strong and long vibrations may be used: '= * ='

As mentioned above, based on the direction of the sound, one or more motors on different positions vibrate.

Returning to FIG. 4, from block 408 the logic proceeds to block 410 to activate one or more haptic generators 308 according to the identification of haptic type at block 408. Note that an example haptic type identified at block 408 may be regarded as a baseline particularly in terms of the amplitude of the demanded haptic feedback, and that this baseline may be increased or decreased in step with higher and lower speaker 305 volumes.

Haptic feedback with directional information can be implemented by using multiple vibration motors built in different spots on the earbuds or headphones unit.

Figure 6:
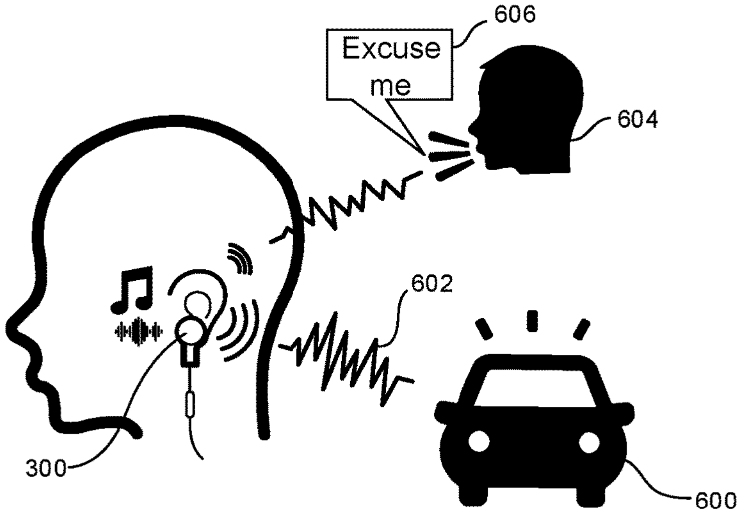
FIG. 6 is a schematic diagram illustrating various types of ambient sound that a user may wish to know about but that would be suppressed by noise-canceling headphones.

FIG. 6 illustrates various types of ambient context that is sensed by using the microphones 310 of FIG. 3 and disclosure herein, as noise suppression features of the wearable device 300 may block the user's hearing capability. Events that a user may want to notice include dangerous situations, such as a 600 car approaching and/or honking 602, or a person 604 calling the user's attention using terms 606 like "hey", "excuse me", or calling the user by name, etc. The sensitivity of event detection and haptic feedback can be adaptive to the sound volume level of the speakers of the wearable device. For example, the higher volume the user is listening to, the stronger haptic feedback may be generated.

Figure 7:
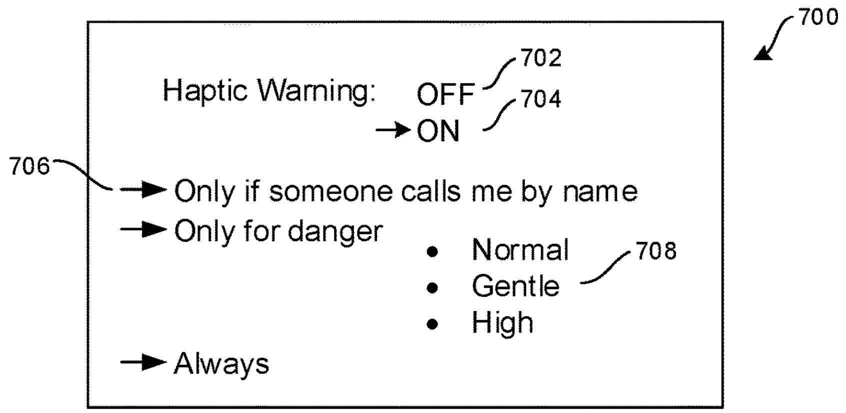
FIG. 7 is a screen shot of an example user interface consistent with present principles.

FIG. 7 illustrates an example user interface (UI) 700 that may be provided, e.g., by a downloaded application on a mobile phone to allow a user of the wearable device to change the sensitivity and feedback strength of the haptic signaling. A selector 702 may be provided to turn off haptic signaling described herein, while another selector 704 may be provided to enable the above-disclosed haptic signaling. The user may also select from a list 706 if he or she always wants haptic signaling on for all ambient noise, or for only certain types of ambient noise such as someone calling the user's name, or dangerous situations. The user may also select from a list 708 whether to employ normal baseline haptic feedback intensity, gentle baseline haptic feedback intensity, or high baseline haptic feedback intensity.

Before concluding, it is to be understood that although a software application for undertaking present principles may be vended with a device such as the system 100, present principles apply in instances where such an application is downloaded from a server to a device over a network such as the Internet. Furthermore, present principles apply in instances where such an application is included on a computer readable storage medium that is being vended and/or provided, where the computer readable storage medium is not a transitory signal and/or a signal per se.

It is to be understood that whilst present principals have been described with reference to some example embodiments, these are not intended to be limiting, and that various alternative arrangements may be used to implement the subject matter claimed herein. Components included in one embodiment can be used in other embodiments in any appropriate combination. For example, any of the various components described herein and/or depicted in the Figures may be combined, interchanged or excluded from other embodiments.

What is claimed is:

1. A device, comprising:

at least one computer memory that is not a transitory signal and that comprises instructions executable by at least one processor to:

sense ambient sound;

determine at least one parameter of the ambient sound; and based at least in part on the at least one parameter, activate at least one haptic generator, wherein the instructions are executable to:

responsive to identifying the at least one parameter of ambient sound as noise from an approaching vehicle and to identifying the device is in a street, the instructions are executable to return a first tactile signal; and responsive to identifying the at least one parameter of ambient sound as noise from an approaching vehicle and to identifying the device is on a sidewalk, the instructions are executable to return a second tactile signal different from the first tactile signal.

2. The device of claim 1, wherein the at least one parameter comprises a type of sound.

3. The device of claim 1, wherein the at least one parameter comprises a direction of sound.

4. The device of claim 1, wherein the at least one parameter comprises a location of sound origination.

5. The device of claim 1, wherein the at least one parameter comprises an amplitude of sound.

6. The device of claim 1, wherein the at least one parameter comprises speech in the ambient sound.

7. The device of claim 1, wherein the instructions are executable to, based at least in part on the at least one parameter, establish a location of haptic feedback on a head-wearable speaker assembly.

8. The device of claim 1, wherein the instructions are executable to, based at least in part on the at least one parameter, establish an intensity of haptic feedback on a head-wearable speaker assembly.

9. The device of claim 1, wherein the instructions are executable to, based at least in part on a speaker volume of a head-wearable speaker assembly, establish an intensity of haptic feedback on the head-wearable speaker assembly.

10. The device of claim 1, comprising the at least one processor.

11. A method comprising:

identifying that ambient sound impinging on a wearable listening device is correlated to a moving vehicle;

responsive to identifying that the ambient sound is correlated to a moving vehicle and to identifying that the device is in a first type of location, return a first haptic feedback signal; and responsive to identifying, that the ambient sound is correlated to a moving vehicle and to identifying that the device is in a second type of location, return a second haptic feedback signal.

12. The method of claim 11, wherein the wearable listening device comprises noise-canceling earbuds.

13. The method of claim 11, wherein the identifying the ambient sound is based at least in part on a type of sound.

14. The method of claim 11, wherein the identifying the ambient sound is based at least in part on a direction of sound.

15. The method of claim 11, wherein the identifying the ambient sound is based at least in part on an amplitude of sound.

16. The method of claim 11, comprising, based at least in part on the ambient sound, establishing a location of haptic feedback on the wearable listening device.

17. The method of claim 11, comprising, based at least in part on the ambient sound, establishing an intensity of haptic feedback on the wearable listening device.

18. The method of claim 11, comprising, based at least in part on the ambient sound, establishing an intensity of haptic feedback on headphones.

19. The device of claim 1, comprising a head-wearable headphone assembly, the at least one haptic generator being on the head-wearable headphone assembly.

20. The device of claim 19, wherein the ambient sound is sensed by at least one microphone on the head-wearable headphone assembly.

* * * * *